(12) United States Patent
Camp, Jr.

(10) Patent No.: US 7,477,186 B2
(45) Date of Patent: Jan. 13, 2009

(54) MEMORY SYSTEMS WITH COLUMN READ TO AN ARITHMETIC OPERATION CIRCUIT, PATTERN DETECTOR CIRCUITS AND METHODS AND COMPUTER PROGRAM PRODUCTS FOR THE SAME

(75) Inventor: William O. Camp, Jr., Chapel Hill, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 211 days.

(21) Appl. No.: 11/247,771

(22) Filed: Oct. 11, 2005

(65) Prior Publication Data

US 2007/0080856 A1    Apr. 12, 2007

(51) Int. Cl.
*G01S 1/00* (2006.01)
*H04B 1/66* (2006.01)
*H03M 1/12* (2006.01)

(52) U.S. Cl. ............................. 342/357.12; 375/240.16; 341/156

(58) Field of Classification Search ........................ 342/357.01–357.17; 375/240.16; 341/156
See application file for complete search history.

(56) References Cited

U.S. PATENT DOCUMENTS

| | | | | |
|---|---|---|---|---|
| 5,386,390 A * | 1/1995 | Okitaka | ................. | 365/230.06 |
| 6,204,808 B1 * | 3/2001 | Bloebaum et al. | ...... | 342/357.07 |
| 6,252,543 B1 | 6/2001 | Camp | ................... | 342/357.06 |
| 6,775,616 B1 * | 8/2004 | Nysen | ......................... | 701/300 |
| 2002/0009144 A1 * | 1/2002 | Ishihara et al. | ......... | 375/240.16 |
| 2003/0151547 A1 * | 8/2003 | Mauro et al. | ........... | 342/357.15 |
| 2003/0201935 A1 * | 10/2003 | King et al. | ............. | 342/357.15 |
| 2004/0019723 A1 | 1/2004 | Au et al. | ...................... | 711/131 |
| 2004/0199724 A1 * | 10/2004 | Jalowiecki et al. | .......... | 711/128 |
| 2004/0202235 A1 * | 10/2004 | Kohli et al. | .................. | 375/150 |
| 2005/0160342 A1 * | 7/2005 | Wellig et al. | ................. | 714/755 |
| 2005/0264446 A1 * | 12/2005 | Underbrink et al. | ..... | 342/357.07 |
| 2005/0283512 A1 * | 12/2005 | Okamoto et al. | ............ | 708/402 |
| 2006/0022048 A1 * | 2/2006 | Johnson | ................... | 235/462.1 |
| 2006/0039201 A1 * | 2/2006 | Warner | ................... | 365/189.01 |
| 2006/0071843 A1 * | 4/2006 | Champion | .................. | 341/156 |
| 2007/0147483 A1 * | 6/2007 | Tang | .......................... | 375/149 |

FOREIGN PATENT DOCUMENTS

EP      1 538 454 A1     6/2005
WO    WO 01/01422 A1    1/2001

OTHER PUBLICATIONS

International Search Report and Written Opinion for PCT/US2006/022345; date of mailing Nov. 23, 2006.

* cited by examiner

*Primary Examiner*—Thomas H Tarcza
*Assistant Examiner*—Harry Liu
(74) *Attorney, Agent, or Firm*—Myers Bigel Sibley & Sajovec

(57) ABSTRACT

Memory systems include an array of storage cells arranged in a row and column arrangement. A plurality of data write lines coupled to the array are configured to supply data into a selected row of the array. A plurality of data read lines coupled to the array are configured to receive data from a selected column of the array in a single read operation. An arithmetic operation circuit coupled to the plurality of data read lines is configured to generate a result value based on data read from the storage cells of a selected column of the array. Methods of detecting a pattern, such as a color code pattern, are also provided.

14 Claims, 7 Drawing Sheets

FIGURE 3

| A1,1 | A1,2 | A1,3 | ... | | | | | | | | | | | | A1,15 | A1,16 |
|---|---|---|---|---|---|---|---|---|---|---|---|---|---|---|---|---|
| A2,1 | A2,2 | A2,3 | | | | | | | | | | | | | A2,15 | A2,16 |
| A3,1 | A3,2 | A3,3 | | | | | | | | | | | | | | A3,16 |
| ... | | | | | | | | | | | | | | | | |
| | | | | | | | A8,8 | A8,9 | | | | | | | | |
| | | | | | | | A9,8 | | | | | | | | | |
| | | | | | | | | | | | | | | | | |
| | | | | | | | | | | | | | | | | |
| | | | | | | | | | | | | | | | | |
| | | | | | | | | | | | | | | | | |
| | | | | | | | | | | | | | | | | |
| | | | | | | | | | | | | | | | | |
| | | | | | | | | | | | | | | | | |
| | | | | | | | | | | | | | | | | |
| A15,1 | | | | | | | | | | | | | | | | A15,16 |
| A16,1 | | | | | | | | | | | | | | | | A16,16 |

MEMORY SYSTEMS WITH COLUMN READ TO AN ARITHMETIC OPERATION CIRCUIT, PATTERN DETECTOR CIRCUITS AND METHODS AND COMPUTER PROGRAM PRODUCTS FOR THE SAME

BACKGROUND OF THE INVENTION

The present invention relates generally to memory systems, and more particularly to memory systems with a row write, column read arrangement.

A variety of applications use memory in conjunction with other circuitry to provide different device functionality. In many cases, such memory is utilized by a processor device configured to execute software that may use the memory in connection with program execution. In other instances, specialized hardware may be used to provide logical operations and/or the like in a manner that may be faster than that provided by software executing on a general purpose processor. In addition, it is known to combine a general purpose processor with specialized hardware in some applications.

One area where such a combination of hardware and software is often used is in wireless communication devices, such as mobile terminals and position location receiver devices, such as Global Positioning System (GPS) receivers. There are a variety of applications in such devices where it may be important to recognize a pattern in received communication signals, such as transmissions from a base station of a wide area cellular mobile telecommunications network for a mobile terminal or from a GPS satellite for a GPS receiver. It may be desirable in such devices to recognize a pattern rapidly while the signal is being received or to acquire a service and/or position determination rapidly to provide greater perceived value to a user of the device. Accordingly, it is known to use digital signal processor (DSP) or the like in such devices.

The GPS location approach generally uses location services not associated with either the uplink or downlink signals used in the mobile telecommunications network. In a typical GPS application, the GPS receivers collect and analyze ranging measurements from signals transmitted by GPS satellites having known locations.

Figure 1:
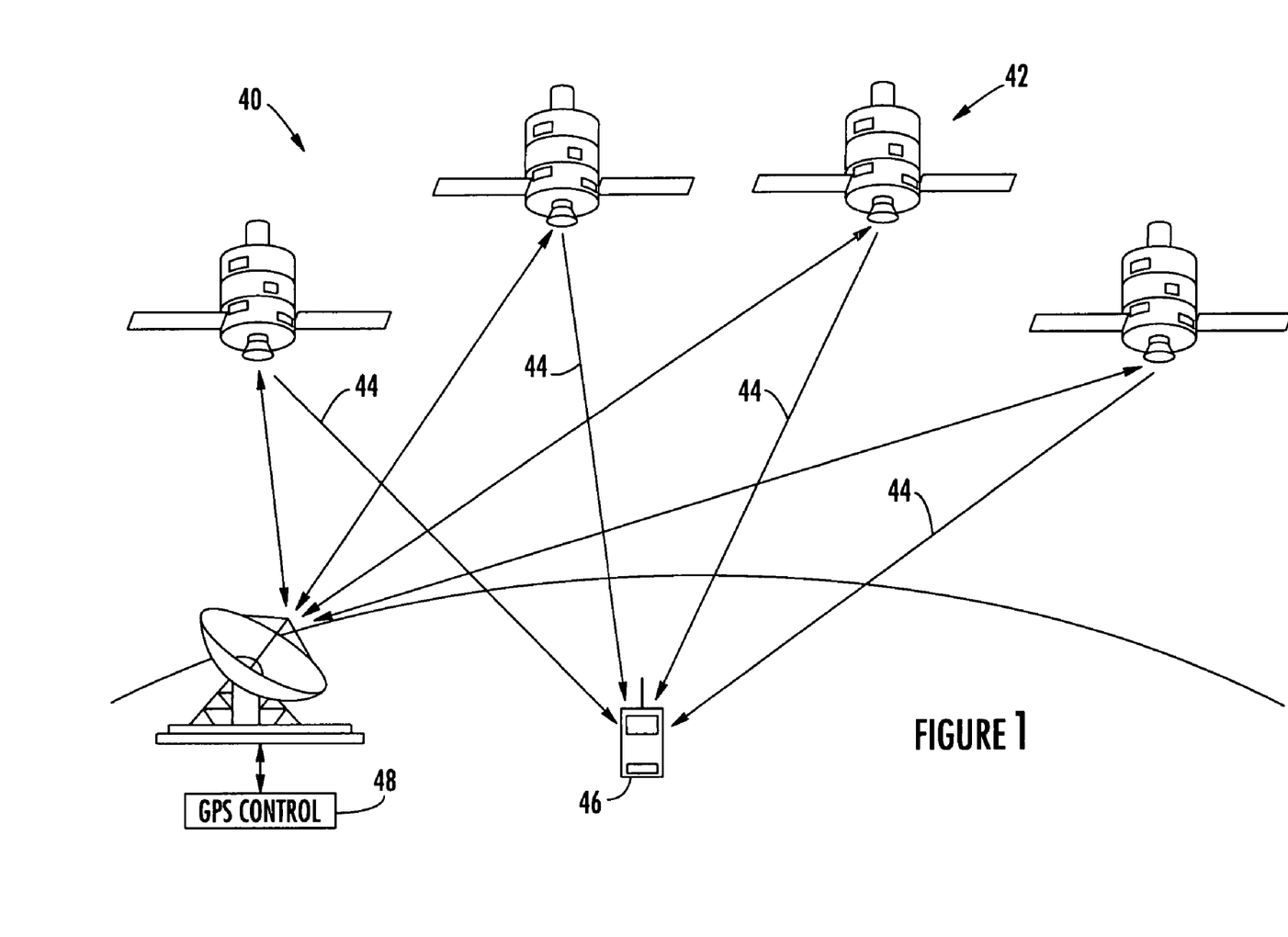
FIG. 1 is schematic block diagram illustrating a GPS system.

As illustrated in FIG. 1, GPS is a space-based triangulation system using satellites 42 and GPS control computers 48 to measure positions anywhere on the earth. GPS was first developed by the United States Department of Defense as a navigational system. The advantages of this navigational system over land-based systems are that it is not limited in its coverage, it provides continuous 24-hour coverage, which may be highly accurate regardless of weather conditions. In operation, a constellation of 24 satellites 42 orbiting the earth continually emit a GPS radio signal 44. A GPS receiver 46, e.g., a hand-held radio receiver with a GPS processor, receives the radio signals from the visible satellites and measures the time that the radio signal takes to travel from the GPS satellites to the GPS receiver antenna. By multiplying the travel time by the speed of light, the GPS receiver can calculate a range for each satellite in view. Ephemeris information provided in the satellite radio signal typically describes the satellite's orbit and velocity, thereby generally enabling the GPS processor to calculate the position of the GPS receiver 46 through a process of triangulation. It is known to include a GPS receiver 46 in a mobile terminal to provide position location functionality to the mobile terminal.

The radio signal 44 generally provides a location determination signal to a GPS receiver by including a unique color code pattern, referred to as a C/A code, that is associated with a particular GPS satellite 42. In other words, different GPS satellites 42 are provided different color codes. A time of flight of a radio signal 44 from a GPS satellite 42 to a GPS receiver 46 may be determined by determining a period and phase of the color code as received at the GPS receiver 46 when the GPS receiver 46 and GPS satellite 42 share a common time reference. Determining a time of flight typically includes determining a code period (i.e., a number of entire "chips" of the color code delay) and a code phase (i.e., the fractional part of a partial "chip" delay) based on characteristics of the C/A code, defined for GPS as 1023 chips/millisecond. However, doing so requires that a pattern associated with a GPS color code first be located and detected in a received signal before a time of flight can be estimated based on a determined delay. Operations for detecting a color code typically require that a plurality of samples be taken from a received signal and energies be accumulated in the process of detecting what color code pattern is present and where the repeating color code pattern starts in the received signal.

Pattern detection also may be used in other communication applications, such as code division multiple access (CDMA) communication systems, where signal energies are spread across a range of frequencies using a spreading code.

SUMMARY OF THE INVENTION

Some embodiments of the present invention provide memory systems including an array of storage cells arranged in a row and column arrangement. A plurality of data write lines coupled to the array are configured to supply data into a selected row of the array. A plurality of data read lines coupled to the array are configured to receive data from a selected column of the array in a single read operation. An arithmetic operation circuit coupled to the plurality of data read lines is configured to generate a result value based on data read from the storage cells of a selected column of the array.

In other embodiments of the present invention, the memory systems further include a control circuit configured to select the storage cells in a selected row of the array responsive to a write address input signal by coupling the data write lines to the storage cells in the selected row and to select the storage cells in a selected row of the array responsive to a read address input signal by coupling the data read lines to the storage cells in the selected column to provide data from the storage cells in the selected column to the arithmetic operation circuit. The write lines may be substantially orthogonal to the read lines. A second plurality of data read lines may be coupled to the array and configured to receive data from a selected row of the array in a single read operation.

In further embodiments of the present invention, the arithmetic operation circuit is a pattern detector configured to detect a pattern based on a comparison of the data read from the storage cells of the selected column of the array to a candidate pattern and to provide a pattern detect signal as the result value. The pattern detector may be configured to detect a color code pattern from a Global Positioning System (GPS) satellite and the pattern detect signal may be an identification of the GPS satellite when the comparison indicates that data read corresponds to a candidate pattern associated with the GPS satellite. The pattern detector may be configured to compare data read from the array to a plurality of candidate patterns associated with different GPS satellites.

In other embodiments of the present invention, the control circuit is configured to write data corresponding to acquired data from a plurality of sequential chips of the color code pattern from a first sample of a received signal in a first row of the array and from subsequent samples in subsequent rows of the array to provide a plurality of data associated with respective ones of the sequential chips in corresponding columns of the array. The pattern detector may be configured to determine an energy associated with the sequential chips based on data read from a plurality of selected columns of the array to determine if the data read from the array corresponds to the candidate pattern associated with the GPS satellite.

In yet other embodiments of the present invention, a GPS circuit is provided including the memory system of claim 7. The GPS circuit further includes a receiver configured to receive a location detection signal from the GPS satellite to provide a received signal. The GPS circuit also includes a controller configured to repeatedly sample the received signal at a candidate start time and at a chip rate of the candidate pattern associated with the GPS satellite to generate a plurality of sets of data samples and to store the plurality of sets of data samples in the storage cells of selected rows of the array. Each of the data sets is stored in an associated row of the array selected by the controller in a single read operation. The controller may further be configured to determine a pseudo-range to the GPS satellite based on the received signal and the identification of the GPS satellite. The array of storage cells may include a number of rows corresponding to a coherent integration period of the GPS circuit and a number of columns corresponding to a number of data samples in a set of data samples.

In further embodiments of the present invention, the arithmetic operation circuit includes a summer configured to sum the data read from the storage cells of the selected column of the array and to provide the sum as the result value. The arithmetic operation circuit may further include a comparator configured to compare the sum result value to a reference value and to provide a result of the comparison as the result value. The arithmetic operation circuit may also be configured to store the sum result value and/or the comparison result value.

In yet further embodiments of the present invention, mobile devices are provided including a memory system as described above and a GPS receiver coupled thereto. The mobile devices may include a transceiver configured to communicate with a wide area cellular communications network.

In other embodiments of the present invention, methods for detecting a pattern include obtaining a plurality of sequenced data values. The sequenced data values are stored in a selected row of an array of storage cells arranged in a row and column arrangement. A different row of the array is selected. Operations for obtaining a plurality of sequenced data values, storing the sequenced data values and selecting a different row are repeated a plurality of times and then the stored data values are read from a selected column of the array of storage cells into a pattern detector in a single read operation. The pattern is detected based on the read stored data values. Obtaining a plurality of sequenced data values may include sampling a signal to obtain the plurality of sequenced data values, the plurality of sequenced data values being representative of the signal, and detecting the pattern may include detecting the pattern in the sampled signal. Reading the stored data values may include reading the stored data values from a plurality of the columns of the array of storage cells into the pattern detector. Each of the plurality of columns of the array of storage cells may be read into the pattern detector in a single read operation.

In further embodiments of the present invention, reading the stored data values and detecting the pattern includes reading the stored data values into a summer of the pattern detector, summing the read data values and selecting a different column of the array. Operations of reading the stored data values, summing the read data values and selecting a different column are repeated a plurality of times to generate a plurality of sums of read data values from respective columns of the array of storage cells. The pattern is detected in the sampled signal based on the plurality of sums. Detecting the pattern in the sampled signal based on the plurality of sums may include comparing the respective sums to a reference value.

In other embodiments of the present invention, computer program products are provided for detecting a pattern, the computer program products including computer program code embodied in a computer readable medium. The computer program code includes program code configured to carry out a method for detecting a pattern as described above.

In yet further embodiments of the present invention, methods for detecting a Global Positioning System (GPS) color code pattern include receiving a location detection signal from a GPS satellite to provide a received signal. The received signal is sampled at a candidate start time and at a chip rate of a candidate color code pattern associated with the GPS satellite to generate a set of time sequenced data samples. The set of data samples is stored in a selected row of an array of storage cells arranged in a row and column arrangement. A next candidate start time and a different row of the array are selected. Operations for receiving a location detection signal, sampling the received signal, storing the sequenced data samples and selecting a next candidate start time and a different row are repeated a plurality of times. The stored data samples are then repeatedly read from respective selected columns of the array of storage cells into a pattern detector in a single read operation per column. The color code pattern is detected based on the read stored data samples and the candidate color code pattern associated with the GPS satellite.

In other embodiments of the present invention, detecting the color code pattern includes summing the data samples from each column read into the pattern detector to determine energy levels associated with respective ones of the columns that correspond to respective time sequence positions in the received signal. The respective energy levels are compared to a reference value to generate corresponding comparison result values corresponding to the respective time sequence positions in the received signal. The comparison result values are compared to values in the candidate color code pattern associated with a same time sequence position.

In some embodiments of the present invention, comparing the comparison results includes comparing the comparison results to a plurality of candidate color code patterns to determine an identification of the GPS satellite providing the received location detection signal and the method further includes determining a pseudo-range to the GPS satellite based on the received location signal and determining a position of the GPS satellite based on the identification of the GPS satellite. Selecting a next candidate start time may include selecting a same candidate start time a plurality of times. A same reference level may be used for a plurality of the energy levels.

In further embodiments of the present invention, obtaining a plurality of sequenced data values includes storing the data values in a first memory. Storing the sequenced data values in a selected row includes reading the sequenced data values from the first memory and repeating obtaining a plurality of sequenced data values includes selecting a different plurality of the stored data values in the first memory. Reading the stored data values may further include reading the stored data values from a plurality of the columns of the array of storage cells into the pattern detector, wherein each of the plurality of columns of the array of storage cells is read into the pattern detector in a single read operation.

In yet further embodiments of the present invention, detecting the pattern includes detecting a Primary Synchronization Channel (SCH) in a code division multiple access (CDMA) downlink signal and/or detecting a Secondary SCH in the CDMA downlink signal. Detecting the pattern may include determining a location of a predetermined bit sequence that is a subset of bits within a Primary Synchronization Channel (SCH) bit sequence in a code division multiple access (CDMA) downlink signal, the sequenced data values stored in each row corresponding to respective repeats of the Primary SCH. Determining the location of the predetermined bit sequence in such embodiments may be followed by storing respective repeats of the predetermined bit sequence into respective rows of the array of storage cells, reading the stored respective repeats of the predetermined bit sequence from a selected column of the array of storage cells into the pattern detector in a single read operation and identifying the predetermined bit sequence as corresponding to one of a plurality of candidate bit sequences based on the read stored respective repeats of the predetermined bit sequence.

DETAILED DESCRIPTION OF THE INVENTION

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular exemplary embodiments illustrated in the accompanying drawings is not intended to be limiting of the invention. In the drawings, like numbers refer to like elements.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be appreciated by one of skill in the art, some embodiments of the present invention may be embodied as a method, data processing system, or computer program product. Accordingly, the present invention may take the form of an entirely hardware embodiment, an entirely software embodiment or an embodiment combining software and hardware aspects all generally referred to herein as a "circuit" or "module." Furthermore, the present invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

The present invention is described in part below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks. Some embodiments of the present invention are described herein with reference to software/data objects. It will be understood that some embodiments of the present invention may be implemented using an object oriented design or procedural programming design.

While various embodiments of the present invention relate to memory systems that may be suitable for use with pattern detection or the like, some embodiments of the present invention particularly relate to pattern detection for GPS location. While satellite based location systems are referred to herein by reference to GPS, it will be understood that, as used herein, reference to GPS refers to any system wherein location information is transmitted to a receiver from a determinable location transmitter where the transmitted location information includes a pattern that is detected for purposes of determining a location of the receiving device. As used herein, the received pattern will be referred to as a "color code." The specific set of color codes used by the Global Positioning System provided by the United States are generally referred to as Gold codes.

By way of background, for the GPS location technique, as discussed above, the positions of the GPS satellites vary with regard to time. Thus, a GPS receiver generally needs to know the positions of the GPS satellites at the time of the ranging measurements. The ranging measurements between an autonomous GPS receiver and each of at least four (4) GPS satellites generally occur by: 1) finding the starting point on the 1023 chip long C/A sequence within the signal transmitted by each GPS satellite; 2) finding the start time of a bit edge; and 3) finding the start time of the data message. The resulting "time of flight" for the signal received from each GPS satellite is then converted to a distance range from the receiver to the satellite (i.e., Euclidian space location information, generally in meters). The resulting four (4) range (or pseudo-range) measurements allow for a solution to the GPS receiver's position in x, y and z coordinates and for determination of the unknown time difference between the GPS time and the GPS receiver's independent clock. Thus, internal to the GPS receiver, signal space information is obtained (from the received signals) and processed to provide a range information and/or position as an output of the GPS receiver. Further discussion of mathematical solutions suitable for use with some GPS type systems is provided in U.S. Pat. No. 6,252,543.

Figure 2:
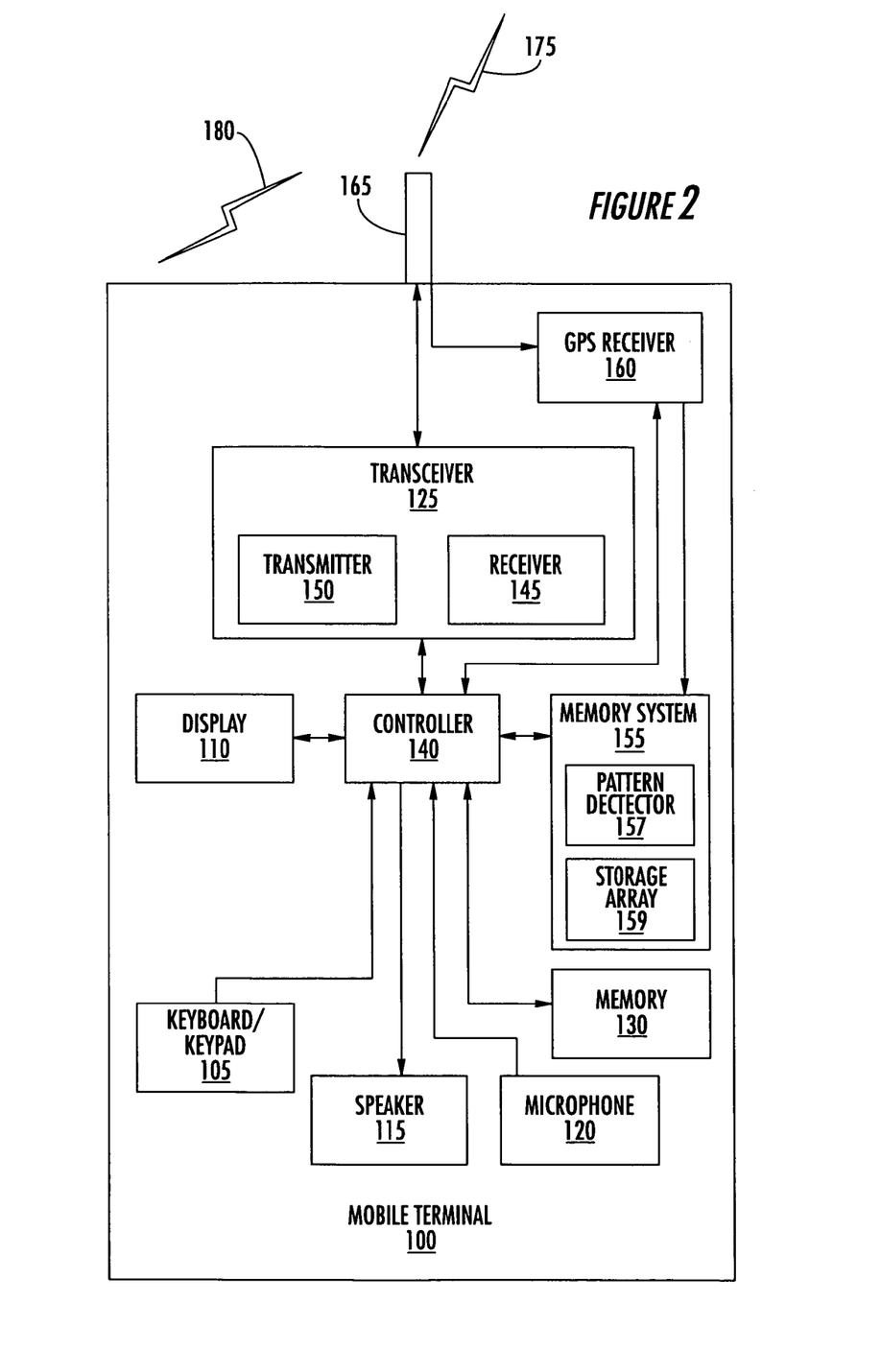
FIG. 2 is schematic block diagram illustrating a mobile terminal including a GPS receiver and a pattern detector according some to embodiments of the present invention.

Embodiments of the present invention will now be further described with reference to the schematic block diagram illustration of a mobile terminal 100 in FIG. 2. FIG. 2 illustrates a mobile wireless terminal 100, a GPS signal 175 and a wireless communication network signal 180. The mobile terminal 100 may comprise a keyboard/keypad 105, a display 110, a speaker 115, a microphone 120, a network transceiver 125, and a memory 130 that communicate with a controller (processor) 140. The network transceiver 125 typically comprises a transmitter circuit 150 and a receiver circuit 145, which respectively transmit outgoing radio frequency signals to a base station of the wireless communication network and receive incoming radio frequency signals from the base station via an antenna 165. While a single antenna 165 is shown in FIG. 2, it is to be understood that multiple antennas and/or different types of antennas may be utilized based on the types of signals being received. The radio frequency signals transmitted between the mobile terminal 100 and the base station may comprise both traffic and control signals (e.g., paging signals/messages for incoming calls), which are used to establish and maintain communication with another party or destination, and may provide uplink and/or downlink communications. However, the present invention is not limited to such two-way communication systems.

The foregoing components of the mobile terminal 100 may be included in many conventional mobile terminals and their functionality is generally known to those skilled in the art. It should be further understood, that, as used herein, the term "mobile terminal" may include a cellular radiotelephone with or without a multi-line display; a Personal Communications System (PCS) terminal that may combine a cellular radiotelephone with data processing, facsimile and data communications capabilities; a Personal Data Assistant (PDA) that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver. Mobile terminals may also be referred to as "pervasive computing" devices.

In particular, the controller 140 can be any commercially available or custom microprocessor, microcontroller, digital signal processor or the like. The memory 130 may include any memory devices containing the software and data used to implement the circuits or modules used in accordance with embodiments of the present invention. The memory 130 can include, but is not limited to, the following types of devices: cache, ROM, PROM, EPROM, EEPROM, flash memory, SRAM, DRAM and magnetic disk.

Also shown in the mobile terminal 100 of FIG. 2 is a memory system 155 and a GPS receiver 160 that is configured to receive a location detection signal from the GPS satellites 42. The GPS receiver 160, alone or in cooperation with the controller 140, provides data from received location detection signals to the memory system 155.

As shown in the embodiments of FIG. 2, the memory system 157 includes an arithmetic operations circuit, shown as a pattern detector 157 in FIG. 2, and an array of storage cells 159 arranged in a row and column arrangement. The memory system 155 in some embodiments is configured to generate a result value based on data read from the storage cells of a selected column of the array of storage cells 159. For example, as will be further described herein, the memory system 157 may receive data values from the GPS receiver 160 corresponding to samples of a received signal from a GPS satellite and compare those samples to candidate patterns to identify a particular color code associated with a GPS satellite.

Figure 3:
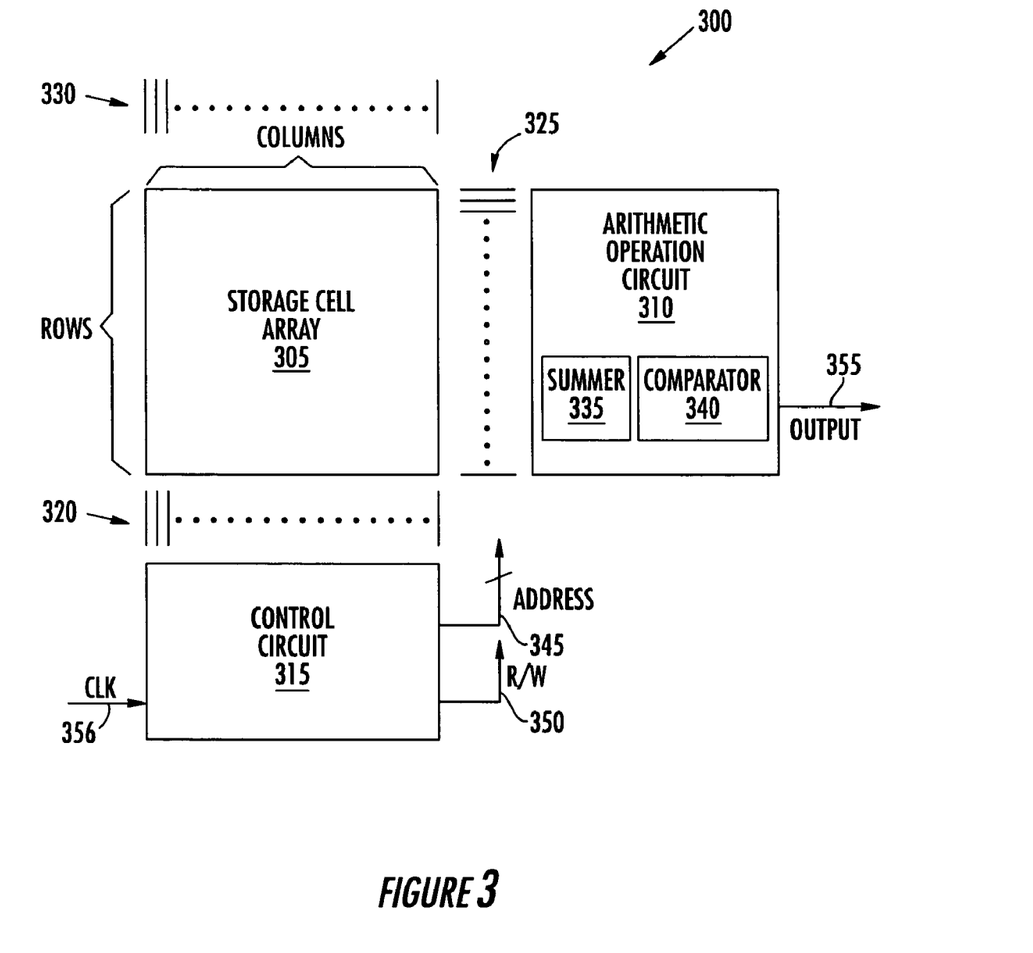
FIG. 3 is a schematic block diagram illustrating a memory system according to some embodiments of the present invention.

Referring now to the schematic circuit diagram of FIG. 3, a memory system 300 according to some embodiments of the present invention will now be further described. The memory system 300 illustrated in FIG. 3 may be used, for example, as the memory system 157 in the mobile terminal 100 or in another device, such as a mobile device that performs position location operations or the like. The memory system 300 shown in the embodiments of FIG. 3 includes a storage cell array 305 including an array of storage cells arranged in a row and column arrangement as indicated in FIG. 3. An arithmetic operation circuit 310 is coupled to the storage cell array 305 by a plurality of data read lines 325 configured to receive data from a selected column of the array in a single read operation. A plurality of data write lines 320 are also coupled to the storage cell array 305 that are configured to supply data into a selected row of the storage cell array 305 in a single write operation or a sequence of write operations, for example, where the data bus width is shorter than the length of a row (e.g., a 256 bit bus use to write to a 2046 or 4092 length row). The arithmetic operation circuit 310 is configured to generate a result value as an output 355 based on data read from the storage cells of a selected column of the storage cell array 305.

Also shown in the illustrated embodiments of FIG. 3 is a control circuit 315 configured to select the storage cells in a selected row of the storage cell array 305 responsive to a write address input signal by coupling the data write lines 320 to the storage cells in the selected row. The address may be provided on the address bus 345 and a write command may be provided on the read/write (R/W) line 350. The write operation may operate responsive to a system clock 356 input to the control circuit 315.

The control circuit 315 may further be configured to select storage cells in a selected column of the array responsive to a read address input signal by coupling the data read lines 325 to the storage cells in the selected column to provide data from the storage cells in the selected column to the arithmetic operations circuit 310.

As shown in the embodiments of FIG. 3, the data write lines 320 are substantially orthogonal to the data read lines 325. Also shown in FIG. 3 are a second plurality of data read lines 330 that are coupled to the storage cell array 305 and configured to receive data from a selected row of the storage cell array 305 in a single read operation. Thus, by providing a second plurality of data read lines 330, data may be read from the storage cell array 305 in either a column or a row direction. While the second plurality of read data lines 330 are shown as a third set of data lines in FIG. 3, it will be understood that the data write lines 320 and the second plurality of data read lines 330 may be implemented by a common set of data lines in the memory system 300 with control of those lines modified for write and read operations in a row-by-row manner.

In the embodiments illustrated in FIG. 3, the arithmetic operation circuit 310 includes a summer 335 configured to sum data read from the storage cells of a selected column of the storage cell array 305 and provide the sum for use in generating a result as value output 355. More particularly, in the embodiments shown in FIG. 3, the sum result value from the summer 335 is provided to a comparator 340 that is configured to compare the sum result value to a reference value and to provide a result of the comparison as the result value output 355. The arithmetic operation circuit 310 may further be configured to store the intermediate sum result value and/or the comparison result value in an internal memory of the arithmetic operation circuit 310, in the storage cell array 305 or in another memory operatively coupled to the arithmetic operation circuit 310, such as the memory 130 illustrated in the mobile terminal 100 of FIG. 2.

In various embodiments of the present invention, the arithmetic operation circuit 310 is a pattern detector configured to detect a pattern based on a comparison of data read from the storage cells of a selected column of the storage cell array 305 to a candidate pattern to provide a pattern detect signal as the result value 355. As illustrated in the embodiments of FIG. 2, the pattern detector 157 may be configured to detect a color code pattern from a global positioning system (GPS) satellite and the pattern detect signal may be an identification of the GPS satellite transmitting the received color code pattern when the data read corresponds to a candidate pattern associated with a particular GPS satellite.

Figure 4:
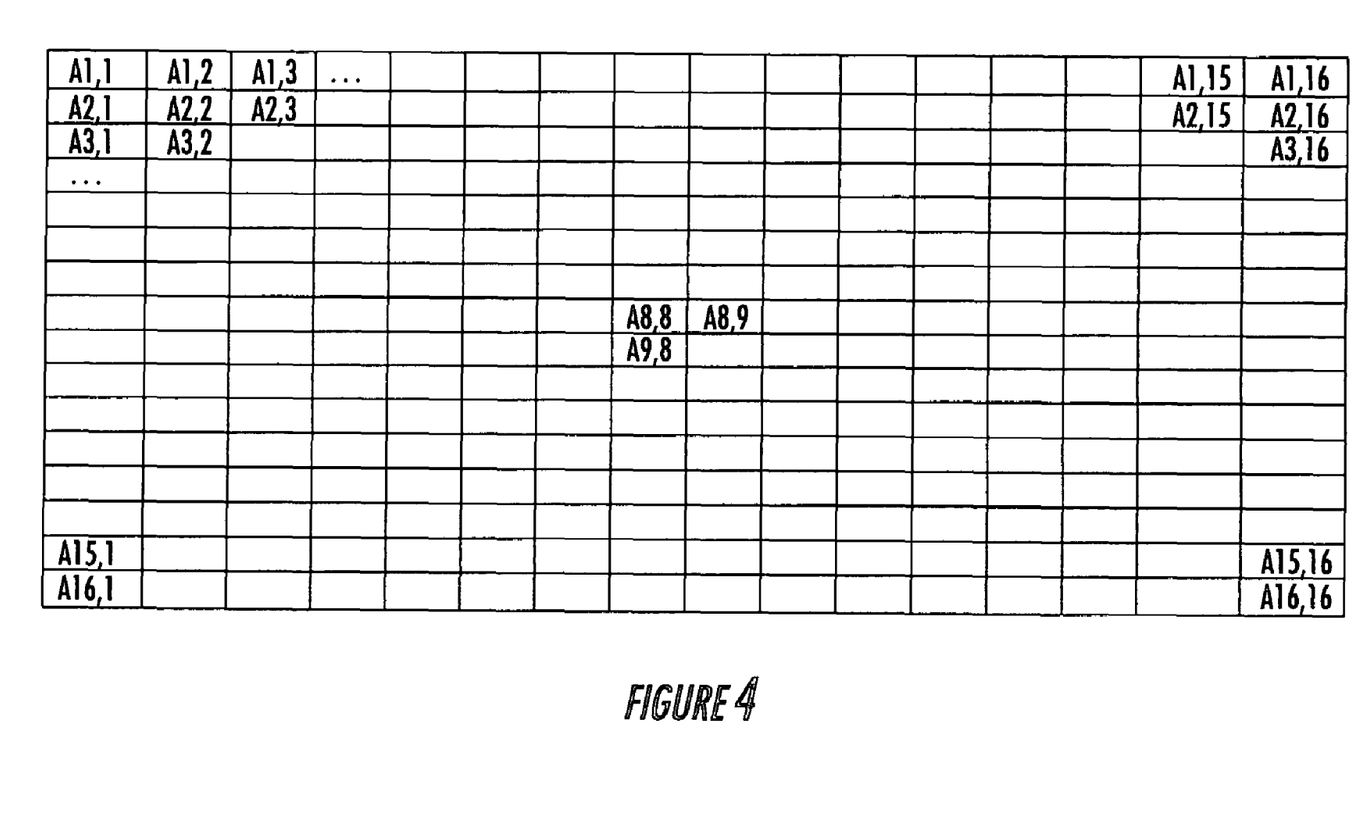
FIG. 4 is a schematic block diagram illustrating a memory array according to some embodiments of the present invention.

A memory storage cell array 305' according to some embodiments of the present invention will now be further described with reference to FIG. 4. As shown in the simplified schematic diagram of FIG. 4 the memory array 305' is illustrated as a two-dimensional array of storage cells that can be written to in one axis and accessed (read) along a second axis. In FIG. 4, the notation $A_{i,j}$ denotes individual bits of information stored in a storage cell of the memory array 305'. As shown in FIG. 4, the bits of information are written to the memory array 305' in rows. For example, a "word" of sixteen bits at a time is shown written to, for instance, $A_{1,1}$; $A_{1,2}$; $A_{1,3}$; ...; $A_{1,15}$; $A_{1,16}$. More generally, words are written to $A_{i,1}$; $A_{i,2}$; $A_{i,3}$; $A_{i,4}$; ...; $A_{i,15}$; $A_{i,16}$; where i equals 1-16 in a portion of a memory cell array 305' illustrated schematically in FIG. 4.

For the memory array 305' of FIG. 4, words can be read back out of memory (into a register of an arithmetic logic unit, for instance) a column of bits at a time. Normally, a user would read bits back in rows as they were originally stored as the normal usage of memory would maintain the integrity of a word as written so that it may be read back out in the same form as originally stored. In the array of FIG. 4, a read "word" maybe read out as, for example, $A_{1,4}$; $A_{2,4}$; $A_{3,4}$; ...$A_{14,4}$; $A_{15,4}$; $A_{16,4}$. More generally, column words may be read from a memory array 305' as $A_{1,j}$; $A_{2,j}$; $A_{3,j}$; ...; $A_{14,j}$; $A_{15,j}$; $A_{16,j}$.

As will be more fully described with reference to the flowchart illustrations herein, a column read memory array arrangement, such as the memory array 305' may be utilized in a memory system with added arithmetic operation functionality and may be particularly well suited to specific processing circumstances. As such, improved processing speeds may be provided for mathematical operations in stand-alone hardware or in combination with software algorithms that may be implemented in a digital signal processor (DSP) or the like to provide higher levels of performance that may be expected by a user. Such column read memory arrays 305' may extend a range of mathematical functions that can be effectively executed by a DSP or a DSP in combination with a coprocessor to increase computation speeds, in some instances (such as a GPS solution), by a factor equal to the coherent integration time in milliseconds.

In some embodiments of the present invention, a word read out as a column may be read into a logic device that sums the bits of the word and yields a binary or gray scale word equal to the sum of the bits in that column based word. A further arithmetic operation of addition may be used to create the sum as described and store that value in a second memory. The sum may also be tested to determine if it is greater than or less than a pre-defined value in a comparator, which may yield a one-bit value for the sum of the bits in the word from the column. This one bit comparison value may also be stored in a second memory.

It will be understood that the memory systems in the memory array 305 of the present invention may be implemented in application specific coprocessors or the like that may be utilized with DSP-based software GPS solutions and other pattern recognition-based applications. Benefits of such an arrangement will now be further described with reference to an exemplary embodiment in which the memory array 305' is utilized in support of a GPS receiver to generate a position determination based on a GPS location signal. In such embodiments, a sampling frequency used in obtaining data samples from a received GPS satellite location detection signal may provide sampling at a frequency that is sufficiently accurate so that the 1023 chips in the GPS color code signal map onto a corresponding integer number of samples in a one millisecond color code pattern time period. As such, the repeating code of a GPS signal color code, repeating every one millisecond, would provide samples i, i+N, i+2N, etc. where N is the integer number of samples in one millisecond, all correspond to the same code phase value [1,−1]. In this case, the same values of samples (after Doppler derotation) can be added over the coherent integration interval before being correlated against the PN code sequence of the color code. This may effectively reduce the correlation time required over conventional GPS methods by the coherent correlation period in milliseconds divided by 1 millisecond.

In some embodiments of the present invention utilized in connection with GPS pattern recognition, the memory array 305' may be configured in the write direction (i.e., a number of columns) corresponding to a number of data samples in a one millisecond period and in the read direction (i.e., a number of rows) corresponding to the coherent integration period in integer milliseconds. With such an arrangement, the (Doppler derotated) data sample values corresponding to the same sample (the same time sequence position in the color code pattern) relative to the start of the one millisecond epic may all be pulled from the memory array 305 in a single-read operation, which generally may be executed on a single clock cycle. When the memory array 305' is integrated with pattern detection logic configured to sum the number of bits and compare them to a threshold value and store the result in a second memory buffer, the entire operation may occur in as little as a single clock cycle. Such an approach may greatly speed up the computational efficiency of the calculation process used to correlate the GPS signal against the candidate PN colorcode and a particular hypothesized offset of the start of that code relative to the sample data.

Hardware solutions for GPS receivers are generally basically a serial sequence of multiply and accumulate operations. These can be replicated multiple times to reduce the time required to search multiple Doppler and code phase locations, which generally must be done for each satellite signal used in a location determination in order to find the pseudorange for each satellite. The physical cost of a multiply accumulator (MAC) is generally much larger than a memory cell plus a shared fraction of summing and comparison hardware that may be used in some embodiments of this present invention. The cost of the MAC may be higher as each MAC is typically a multi-bit device.

Some embodiments of the present invention may be used in Code Division Multiple Access (CDMA) communication devices. A downlink Wideband CDMA WCDMA) signal is typically configured in such a way as to be searched for in accordance with some embodiments of the present invention.

It may be difficult to find a WCDMA signal, particularly when the signal is weak and individual signal bits are below the noise threshold of the receiver device. However, the Primary Synchronization Channel (Primary SCH) of the downlink signal generally includes a known 256 bit sequence that is transmitted at the beginning of every block of 2560 bits. This sequence is generally repeated 15 times in every 10 millisecond time slot period. For pattern detection of such a sequence, some embodiments of the present invention may provide a memory with 2560 bits in a row and a depth (column length) of 15 or more rows (or such other number corresponding to the repeat protocol specified for the signal being detected). The recurring 256 bit pattern will generally occur somewhere in the 2560 bit data samples, and in the same location for each succeeding row in the memory. Thus, the column at a time readout of some embodiments of the present invention may provide for coherent addition of the sampled data energy in those 256 columns where the Primary SCH burst occurs. The summation and pattern recognition as described for various embodiments above may then be used to find the location of that Primary SCH burst relative to the sampled data from the receiver in time, for example, modulo 0.666666. milliseconds.

Once the Primary SCH burst is located, then the 256 samples containing the Primary SCH burst alone out of every block of 2560 receive samples may be used to find the Secondary Synchronization Channel (Secondary SCH). The Secondary SCH is also typically 256 bits long and repeats every 0.66666 . . . milliseconds. Therefore, a smaller memory 256 bits wide by 15 or more rows may be used to sum the energy and to recognize the repeated pattern of the Secondary SCH. In this case, the task in some embodiments is not to find the relative starting point of the pattern but to determine which of 256 patterns possible candidate patterns to which the received signal corresponds. Repeated comparisons in a pattern comparison hardware part with each candidate pattern may then be used to confirm which pattern is used by the Secondary SCH.

As used herein, a "mobile terminal" includes both devices having only a wireless signal receiver without transmit abilities and devices having both receive and transmit hardware capable of two-way communication over a two-way communication link. Such devices may include cellular or other communications devices with or without a multi-line display; Personal Communications System (PCS) terminals that may combine a voice and data processing, facsimile and/or data communications capabilities; Personal Digital Assistants (PDA) that can include a radio frequency receiver and a pager, Internet/Intranet access, Web browser, organizer, calendar and/or a global positioning system (GPS) receiver; and/or conventional laptop and/or palmtop computers or other appliances, which include a radio frequency receiver. As used herein, "mobile terminals" may be portable, transportable, installed in a vehicle (aeronautical, maritime, or land-based), or situated and/or configured to operate locally and/or in a distributed fashion at any other location(s) on earth and/or in space.

Figure 5:
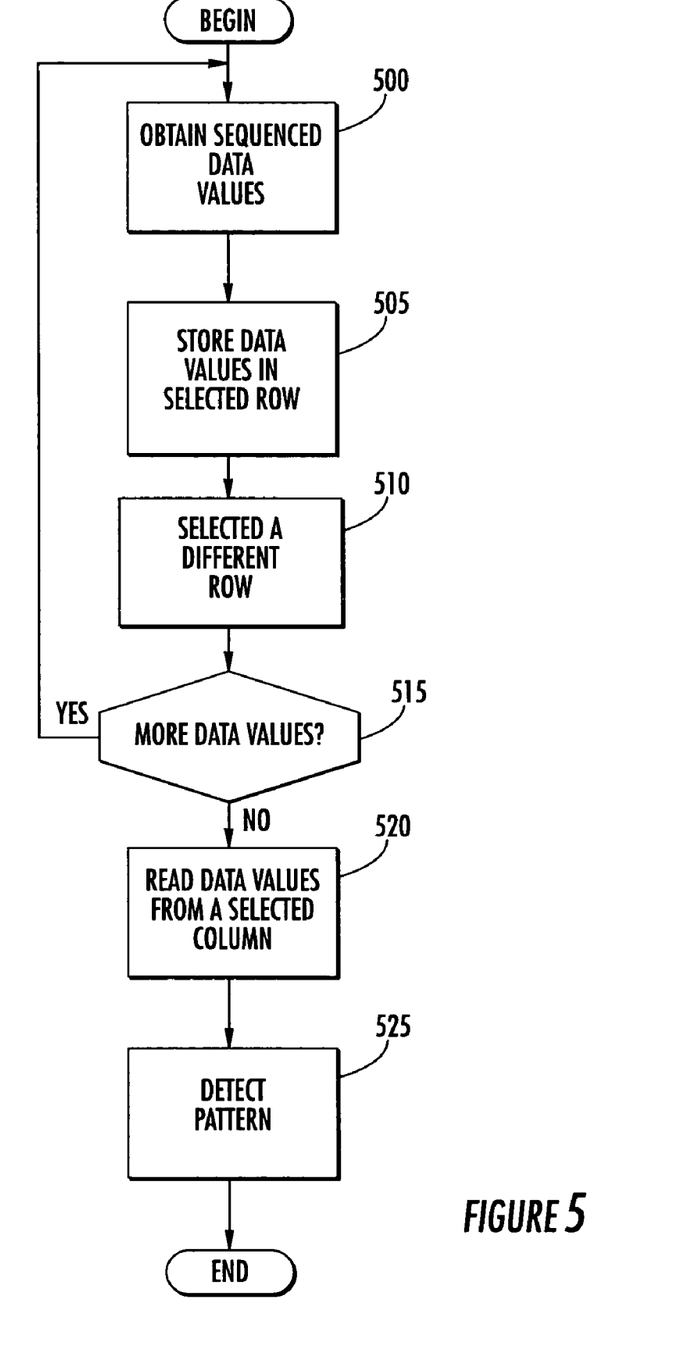
FIG. 5 is a flow chart illustrating operations for detecting a pattern according to some embodiments of the present invention.

Methods for detecting a pattern according to some embodiments of the present invention will now be further described with reference to the flowchart illustration of FIG. 5. As shown in FIG. 5, operations begin by obtaining a plurality of sequenced data values (block 500). For example, a plurality of time sequenced data values may be obtained by sampling a signal to obtain a plurality of sequenced data values that is representative of the signal and detecting the pattern may comprise detecting the pattern in the sampled signal. However, in other embodiments of the present invention, the plurality of sequenced data values may have previously been obtained and stored in memory or the like where they are available for processing in accordance with methods of the present invention.

The sequenced data values are stored in a selected row of an array of storage cells that is arranged in a row and column arrangement (block 505). The sequenced data values are stored in a row. A different row of the array is selected (block 510). If more sets of pluralities of sequenced data values are available for storage (block 515), operations return to repeat blocks 500, 505, and 510 a plurality of times, each time placing a different plurality of sequenced data values in respective rows of the array.

The stored data values are read from a selected column of the array of storage cells into a pattern detector in a single-read operation (block 520). A plurality of columns of stored data values may be read into the pattern detector at block 520, where a single read operation is used for each column of stored data values read into the pattern detector. The pattern is detected based on the read, stored data values (block 525).

Figure 6:
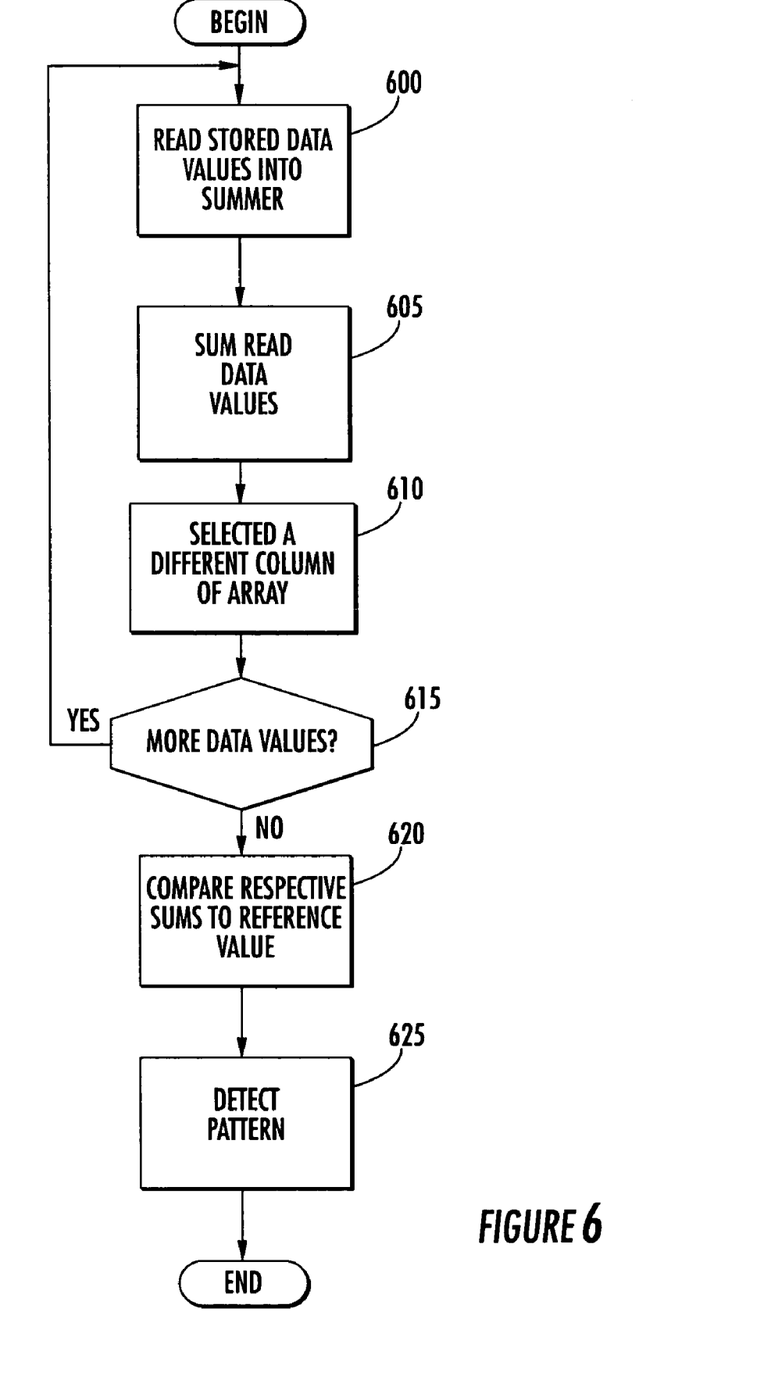
FIG. 6 is a flow chart illustrating operations for detecting a pattern according to other embodiments of the present invention.

Further embodiments of the present invention will now be described with reference to the flowchart illustration of FIG. 6. For the embodiments of FIG. 6, data values are assumed to have already been written into a memory array, for example, as described previously with reference to blocks 500 through 515 of FIG. 5. As illustrated in FIG. 6, operations begin by reading the stored data values from the array into a summer of the pattern detector (block 600). The read data values from a column of the array are summed (block 605). A different column of the array is then selected (block 610). If additional columns containing data values are available (block 615), operations at block 600, 605, and 610 are repeated to generate a plurality of sums of read data values from respective columns of the array of storage cells.

In some embodiments of the present invention, the respective sums are compared to a reference value (block 620). The reference value used may be the same for each column or a different reference value may be used for different columns read from the array. The pattern in the sampled signal is detected based on a plurality of sums (block 625). For example, the reference value may be selected as a decision threshold for a value of the pattern at a sequence position associated with a respective column and the pattern may be recognized by evaluating the sequence of values associated with respective columns.

Figure 7:
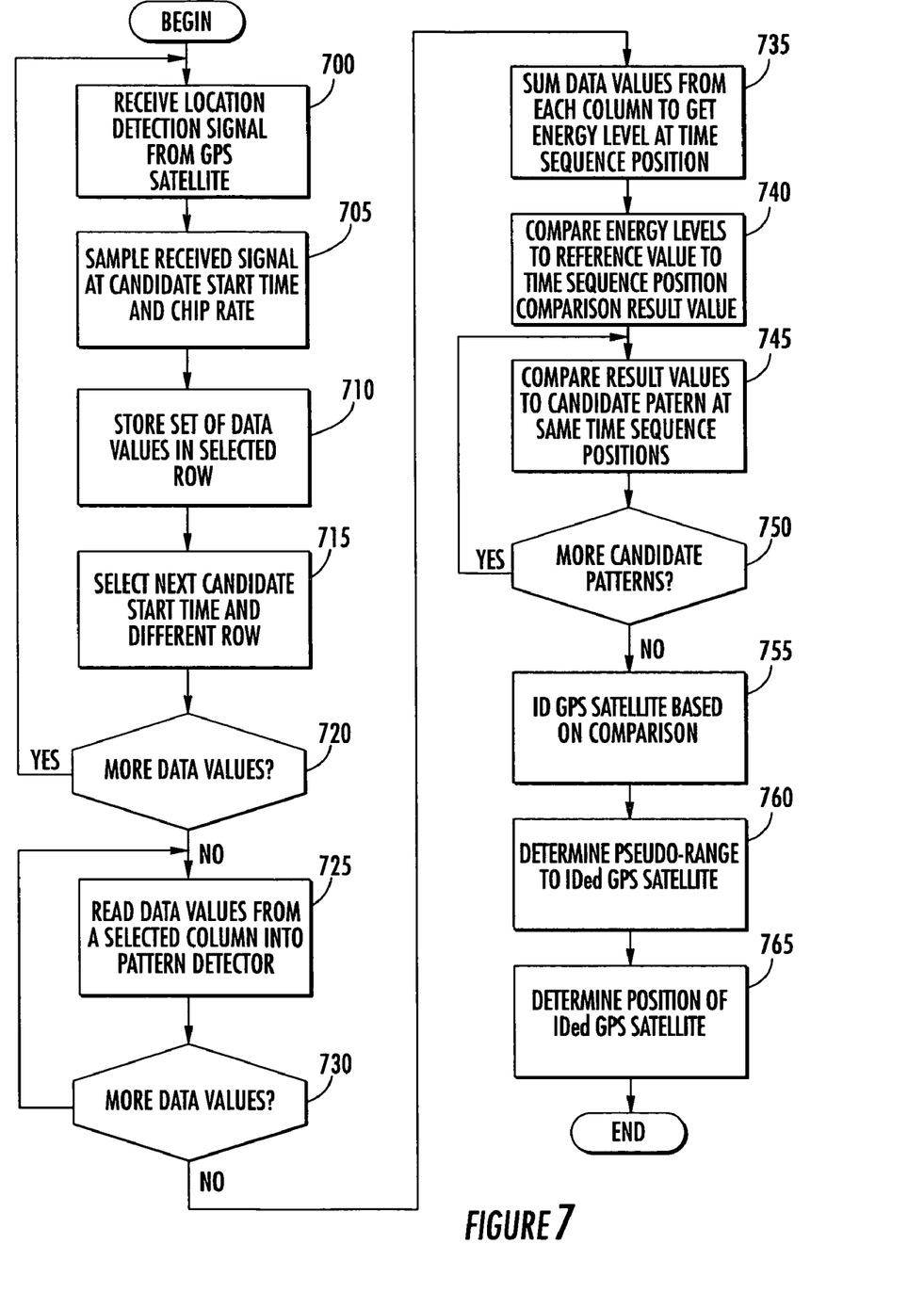
FIG. 7 is a flow chart illustrating operations for detecting a Global Positioning System color code pattern according to some embodiments of the present invention.

Methods for detecting a global positioning system (GPS) color code pattern according to some embodiments of the present invention will now be further described with reference to the flowchart illustration of FIG. 7. As shown for the embodiments of FIG. 7, a location detection signal is received from a GPS satellite to provide a received signal (block 700). The received signal is sampled at a candidate start time and at a chip rate of a candidate color code pattern associated with the GPS satellite to generate a set of time-sequenced data samples (block 705). The set of data samples is stored in a selected row of an array of storage cells arranged in a row in column arrangement (block 710). The set of data samples may be stored in a single write operation.

A next candidate start time and a different row of the array is selected (block 715). In some embodiments of the present invention, the next candidate start time selected may be the same as the previously used candidate start time for obtaining a plurality of different sets of data values. For example, if a start time of a received pattern is known, sampling in each repeated epic of the received signal may begin at the same candidate start time. In other embodiments, the start time may vary when different samples are taken to generate data sets to accommodate uncertainty in start time for a particular epic, Doppler fading and the like. A same candidate start time may be used for a plurality of data sets while a different candidate start time is used for other pluralities of data sets.

In some embodiments of the present invention, the various candidate start time hypothesis are tested by shifting of the candidate pattern, not the data rows before evaluation by the arithmetic operation unit. The candidate pattern may be stored in a row of the column readable storage array or in another memory accessible to the arithmetic operation circuit. In some embodiments of the present invention, received data is obtained and stored in a first memory and then that same set of data is reloaded into the column readable storage array a plurality of times based on different Doppler fading hypothesis. For example, during reloading, particular bits may be skipped, leaving a gap, or bits may be overlapped, to introduce a Doppler fading correction corresponding to the hypothesis. In some embodiments, the received signal may also be reacquired multiple times and stored in the first memory and the reloading into the column readable storage array operations may repeat for each set of received signal data.

If more data values are to be obtained (block 720), operations at block 700 through 715 are repeated to store respective sets of data values representative of sequenced data samples in respective rows of the array. For example, operations at block 720 may repeat over the coherent integration interval for generating the GPS solution.

The stored data samples are read from a respective selected column of the array into a pattern detector in a single-read operation (block 725). If more columns of data values are available for processing (block 730), operations at block 725 are repeated where each column of data values from the array of storage cells is read into the pattern detector in a single-read operation.

Operations related to detecting a color code pattern based on the read stored data samples and a candidate color code pattern associated with the GPS satellite for some embodiments of the present invention will now be described with reference to blocks 735 through 755. Stored data samples from each column read into the pattern detector are summed to determine energy levels associated with respective ones of the columns that correspond to respective time sequence positions in the received signal (block 735). The respective energy levels are compared to a reference value to generate corresponding comparison result values that correspond to the respective time sequence positions in the received signal (block 740). The comparison result values are compared to values in the candidate color code pattern associated with a same time sequence position (block 745).

For some embodiments of the present invention, a plurality of candidate color code patterns are available that may be associated with different ones of the GPS satellites. In such embodiments, as illustrated in FIG. 7, more candidate patterns may be selected (block 750) and operations at block 745 may be repeated until the candidate pattern that matches the obtained data samples is identified. The GPS satellite sending the received location detection signal is then identified based on the comparison of the result values of the candidate patterns, for example, by identifying a GPS satellite that is known to be associated with the best match candidate pattern from the comparisons at block 745 and 750 (block 755).

In some embodiments of the present invention, after the GPS satellite is identified at block 755, operations continue by determining a pseudo-range to the GPS satellite based on the received location detection signal (block 760). A position of the GPS satellite may be determined based on the identification of the GPS satellite (block 765). For example, the position of the satellite may be determined using ephemeris data available to the receiver, which may provide a position of the satellite at a particular time once the satellite is identified. Additional location determination operations may be provided at block 765 using conventional GPS location techniques. Such calculations may be fully performed at a receiving device, may utilize assistance data from a remote location and/or may provide intermediate data, such as the pseudo-range generated at block 760, to a remote location where the position calculation operations are performed to determine the location of the receiving device.

Thus, as described with reference to FIG. 7, a GPS circuit including a memory system according to some embodiments of the present invention may be provided. The GPS circuit and memory system may be included in a device, such as the mobile terminal at 100 illustrated in FIG. 2. In such embodiments, the controller 140 may operate in support of various aspects of operations including those of the memory system 155, a GPS receiver 160 and a transceiver 125. In alternative embodiments, the operations of the controller 140 may be distributed across a plurality of processors in the mobile terminal 100 where the processors may be software-programmable general purpose processors and/or specialized digital signal processors or the like.

In particular embodiments of the present invention, a control circuit may be included in the memory system 155 or implemented by the controller 140 that is configured to write data corresponding to acquired data from a plurality of sequential chips of a color code pattern. The first sample of data of a received signal may be stored in a first row of the storage array 159 and subsequent samples may be stored in subsequent rows of the array 159 to provide a plurality of data associated with respective ones of the sequential chips in corresponding columns of the storage array 159. The pattern detector at 157 may be configured to determine an energy associated with the sequential chips based on data read from a plurality of selected columns of the storage array 159 to determine if the data read from the storage array 159 corresponds to a candidate pattern associated with a particular GPS satellite.

In some embodiments of the present invention, a GPS circuit includes the GPS receiver 160 and a controller, such as the controller 140 or a separate dedicated controller included in the GPS receiver 160. The GPS controller or the controller 140 may be configured to repeatedly sample a received location detection signal from a GPS satellite at a candidate start time and at a chip rate of the candidate pattern associated with the GPS satellite to generate a plurality of sets of data samples and to store the plurality of sets of data samples in the storage cells of selected rows of the storage array 159 in cooperation with the control circuit operability of the memory system 155. Each of the data sets may thereby be stored in an associated row of the storage array 159 selected by the controller in a single-read operation. It will be understood that, as described above, the respective operations of the control circuit and the controller may all be implemented in the controller 140, may be implemented in separate processor circuits or may be implemented as a combination of the above. However, it will be understood that the actual write operations into the array need not be performed by multiple distinct controllers or control circuits and that references herein to one controller storing a plurality of data sets may be implemented by, for example, the controller of the GPS circuit obtaining samples of data values while the control circuit of the memory system 155 executes the operations to store the data values provided from the controller of the GPS circuit in the storage array 159.

The flowchart and block diagrams of FIGS. 2 through 7 illustrate the architecture, functionality, and operations of memory systems and methods, systems, and computer program products for pattern detection according to some embodiments of the present invention. In this regard, each block may represent a module, segment, or portion of code, which comprises one or more executable instructions for implementing the specified logical function(s). It should also be noted that in other implementations, the function(s) noted in the blocks may occur out of the order noted in the figures. For example, two blocks shown in succession may, in fact, be executed substantially concurrently or the blocks may sometimes be executed in the reverse order, depending on the functionality involved.

In the drawings and specification, there have been disclosed typical illustrative embodiments of the invention and, although specific terms are employed, they are used in a generic and descriptive sense only and not for purposes of limitation, the scope of the invention being set forth in the following claims.

That which is claimed is:

1. A memory system, comprising:
  an array of storage cells arranged in a row and column arrangement;
  a plurality of data write lines coupled to the array and configured to supply data into a selected row of the array;
  a plurality of data read lines coupled to the array and configured to receive data from a plurality of cells of a selected column of the array in a single read operation;
  an arithmetic operation circuit coupled to the plurality of data read lines that is configured to generate a result value based on data read from the storage cells of a selected column of the array, wherein the arithmetic operation circuit comprises a pattern detector configured to detect a pattern based on a comparison of the data read from the storage cells of the selected column of the array to a candidate pattern and to provide a pattern detect signal as the result value; and
  a control circuit configured to select the storage cells in a selected row of the array responsive to a write address input signal by coupling the data write lines to the storage cells in the selected row and to select the storage cells in a selected column of the array responsive to a read address input signal by coupling the data read lines to the storage cells in the selected column to provide data from the storage cells in the selected column to the arithmetic operation circuit.

2. The memory system of claim 1, wherein the write lines are substantially orthogonal to the read lines.

3. The memory system of claim 2, further comprising a second plurality of data read lines coupled to the array and configured to receive data from a selected row of the array in a single read operation.

4. The memory system of claim 1, wherein the pattern detector is configured to detect a color code pattern from a Global Positioning System (GPS) satellite and wherein the pattern detect signal comprises an identification of the GPS satellite when the comparison indicates that data read corresponds to a candidate pattern associated with the GPS satellite.

5. The memory system of claim 4, wherein the control circuit is configured to write data corresponding to acquired data from a plurality of sequential chips of the color code pattern from a first sample of a received signal in a first row of the array and from subsequent samples in subsequent rows of the array to provide a plurality of data associated with respective ones of the sequential chips in corresponding columns of the array and wherein the pattern detector is configured to determine an energy associated with the sequential chips based on data read from a plurality of selected columns of the array to determine if the data read from the array corresponds to the candidate pattern associated with the GPS satellite.

6. A GPS circuit including the memory system of claim 5, further comprising:
  a receiver configured to receive a location detection signal from the GPS satellite to provide a received signal; and
  a controller configured to repeatedly sample the received signal at a candidate start time and at a chip rate of the candidate pattern associated with the GPS satellite to generate a plurality of sets of data samples and to store the plurality of sets of data samples in the storage cells of selected rows of the array, wherein each of the data sets is stored in an associated row of the array selected by the controller in a single read operation.

7. The GPS circuit of claim 6, wherein the controller is further configured to determine a pseudo-range to the GPS satellite based on the received signal and the identification of the GPS satellite.

8. The GPS circuit of claim 7, wherein the array of storage cells includes a number of rows corresponding to a coherent integration period of the GPS circuit and a number of columns corresponding to a number of data samples in a set of data samples.

9. The memory system of claim 5, wherein the pattern detector is configured to compare the data read from the array to a plurality of candidate patterns associated with different GPS satellites.

10. The memory system of claim 1, wherein the arithmetic operation circuit comprises a summer configured to sum the data read from the storage cells of the selected column of the array and to provide the sum as the result value.

11. The memory system of claim 10, wherein the arithmetic operation circuit further comprises a comparator configured to compare the sum result value to a reference value and to provide a result of the comparison as the result value.

12. The memory system of claim 11, wherein the arithmetic operation circuit is configured to store the sum result value and/or the comparison result value.

13. A mobile device including the memory system of claim 3 and a GPS receiver coupled thereto.

14. The mobile device of claim 13, further comprising a transceiver configured to communicate with a wide area cellular communications network.

* * * * *